(12) United States Patent
Magnoux (10) Patent No.: US 10,136,540 B2
(45) Date of Patent: Nov. 20, 2018

(54) METHOD FOR PLUGGING AN ELECTRONIC CARD OF AN ELECTRONIC MODULE INTO THE CONNECTOR OF A CHASSIS, ASSOCIATED SYSTEM AND ASSOCIATED MODULE

(71) Applicant: BULL, Les Clayes Sous Bois (FR)

(72) Inventor: Sebastien Magnoux, Mery sur Oise (FR)

(73) Assignee: BULL, Les Clayes Sous Bois (FR)

( * ) Notice: Subject to any disclaimer, the term of this patent is extended or adjusted under 35 U.S.C. 154(b) by 0 days.

(21) Appl. No.: 15/107,410

(22) PCT Filed: Dec. 23, 2014

(86) PCT No.: PCT/EP2014/079277
§ 371 (c)(1),
(2) Date: Jun. 22, 2016

(87) PCT Pub. No.: WO2015/097266
PCT Pub. Date: Jul. 2, 2015

(65) Prior Publication Data
US 2016/0360636 A1    Dec. 8, 2016

(30) Foreign Application Priority Data
Dec. 23, 2013  (FR) ..................................... 13 63372

(51) Int. Cl.
*H05K 7/14*  (2006.01)
(52) U.S. Cl.
CPC ......... *H05K 7/1411* (2013.01); *H05K 7/1461* (2013.01); *H05K 7/1485* (2013.01)
(58) Field of Classification Search
CPC .. H05K 7/1489; H05K 7/1409; H05K 7/1415; H05K 7/1424; H05K 7/14; H05K 7/1461; H05K 7/1485; H05K 7/1411
See application file for complete search history.

(56) References Cited

U.S. PATENT DOCUMENTS

| | | | |
|---|---|---|---|
| 5,644,470 A | * | 7/1997 | Benedict ................. G06F 1/184 361/679.32 |
| 5,657,204 A | * | 8/1997 | Hunt .................... H05K 7/1409 361/752 |

(Continued)

FOREIGN PATENT DOCUMENTS

| | | |
|---|---|---|
| EP | 0 848 320 A2 | 6/1998 |
| EP | 1 776 005 A2 | 4/2007 |
| WO | 03/065780 A1 | 8/2003 |

OTHER PUBLICATIONS

International Search Report, dated Aug. 21, 2015, from corresponding PCT Application.

*Primary Examiner* — Hoa C Nguyen
*Assistant Examiner* — Christopher L Augustin
(74) *Attorney, Agent, or Firm* — Young & Thompson (57) ABSTRACT

A method for plugging into a connector (6) of a chassis (2), an electronic board (3) housed in a unit (10) of an electronic module (1), involving: rectilinear translation of the module (1), relative to the chassis (2), in a first direction (H) so as to insert module (1) into the chassis (2), rectilinear translation of the board (3), relative to the chassis (2), in a second direction (V) different than the first direction (H), so as to plug the board (3) into the connector (6), the rectilinear translation of the board (3) in the second direction (V) in relation to the chassis (2) also being a rectilinear translation of the board (3) in the second direction (V) relative to the housing (10) of the module (1).

19 Claims, 7 Drawing Sheets

(56) References Cited

U.S. PATENT DOCUMENTS

| | | | | |
|---|---|---|---|---|
| 6,115,258 | A * | 9/2000 | Hoyle, Jr. | H05K 7/1409 211/41.17 |
| 6,128,196 | A * | 10/2000 | Hoyle, Jr. | H05K 7/1439 206/454 |
| 6,411,517 | B1 * | 6/2002 | Babin | H01R 23/70 211/41.17 |
| 6,496,385 | B1 * | 12/2002 | Smithson | H05K 7/1461 211/41.17 |
| 6,667,890 | B1 * | 12/2003 | Barringer | G06F 1/184 361/752 |
| 2004/0008497 | A1 * | 1/2004 | Barringer | H05K 7/1409 361/759 |
| 2004/0178318 | A1 * | 9/2004 | Li | G06F 1/184 248/694 |
| 2008/0068813 | A1 * | 3/2008 | Rubenstein | G06F 1/183 361/752 |
| 2008/0094810 | A1 * | 4/2008 | Lajara | G06F 1/185 361/759 |
| 2008/0123274 | A1 * | 5/2008 | Desrosiers | H05K 7/1409 361/737 |
| 2011/0292620 | A1 * | 12/2011 | Hayashi | H05K 7/1489 361/748 |
| 2013/0107424 | A1 * | 5/2013 | Thomas | H05K 7/1411 361/679.01 |
| 2013/0313952 | A1 * | 11/2013 | Wu | G11B 33/128 312/223.2 |

* cited by examiner

METHOD FOR PLUGGING AN ELECTRONIC CARD OF AN ELECTRONIC MODULE INTO THE CONNECTOR OF A CHASSIS, ASSOCIATED SYSTEM AND ASSOCIATED MODULE

FIELD OF THE INVENTION

The invention relates to a method for plugging an electronic card of an electronic module into the connector of a chassis, a plug-in system comprising the electronic module including the electronic card to be plugged in and the chassis including the connector intended to receive this electronic card, as well as the electronic module including the electronic card capable of being plugged in according to the method for plugging of the invention.

CONTEXT OF THE INVENTION

According to a first prior art, electronic cards of electronic modules are known, intended to be plugged into chassis connectors, for which the plugging direction of the electronic card into the connector is the same as the direction for introduction, by sliding of drawer type, of the electronic module in the chassis. If this type of plugging is rather practical at the kinematic level, it still has two disadvantages especially.

A first disadvantage of this first prior art is that when the electronic modules are introduced to the chassis of an electrical cabinet by horizontal sliding, which is more practical for the operator, and the electronic cards are also plugged into the connector horizontally, directional deflection means of electrical connections must then be made towards the electronic motherboard of the chassis, which electronic motherboard is in the horizontal plane of the chassis. These directional deflection means of electrical connections are often complex to manage, in particular because, in directional deflection means of electrical connection, not all tracks will naturally follow paths of the same length (between those more inside the elbow and those more outside the elbow), resulting in the need for extra compensation of different delays to resynchronize the signals corresponding respectively to the different tracks.

A second disadvantage of this first prior art is that there is no place to put an effort reduction system. Consequently, if the plugging force required to correctly plug the electronic card into the connector is considerable, the effort to be applied by the operator pushing the electronic module horizontally into the chassis in the final plugging phase will also be considerable.

According to a second prior art, an electronic module introduced to a chassis by horizontal sliding of drawer type is known. When the electronic module is stopped in the chassis, the assembly of the electronic module is lowered vertically in a second phase to plug the electronic card of the electronic module into the connector of the chassis. If this type of plugging prevents directional deflection means of electrical connections, i.e., deflection means changing the direction of electrical connections which were a major disadvantage of the first prior art, there are all the same two disadvantages especially revealed by the invention.

A first disadvantage of this second prior art is that lowering the assembly of the electronic module causes a defect in stability and precision, which often offsets the male and female portions of the electronic card and the connector relative to each other, resulting in difficult and random plugging, risking damaging elements of the electronic card and connector and making the task more delicate for the operator.

A second disadvantage of this second prior art is that since the assembly of the electronic module is lowered to plug the electronic card into the connector, the effort required by the operator to lower the electronic module corresponds substantially to the force required for plugging the electronic card into the connector, which force can be high, in particular very high for some types of connectors, causing a stressful or even excessive effort for the operator. This effort will be all the more stressful since the need for maintenance of electronic modules will lead to renewing this effort more frequently.

SUMMARY OF THE INVENTION

The aim of the present invention is to provide a method for plugging an electronic card of an electronic module into the connector of a chassis and at least partially eliminating the above disadvantages.

More particularly, the aim of the invention is to provide a method for plugging an electronic card into the connector according to a plugging direction which is different to the direction for introduction of the electronic module into the chassis to avoid directional deflection means of electrical connections, and proposes a method for sufficiently stable and precise plugging to enable satisfactory plugging of the electronic card into the connector, and preferably needing only reduced effort on the part of the operator introducing the electronic module into the chassis, above all when the required plugging force is considerable.

To this end, the present invention proposes a method for plugging an electronic card of an electronic module into the connector of a chassis, a plug-in system comprising the electronic module including the electronic card to be plugged in and the chassis including the connector intended to receive this electronic card, as well as the electronic module including the electronic card capable of being plugged in according to the plugging method of the invention.

To this end, the present invention proposes a method for plugging into a connector of a chassis an electronic card housed in a casing of an electronic module, comprising rectilinear translation of said module, relative to said chassis, along a first direction, so as to insert said module in said chassis, rectilinear translation of said card, relative to said chassis, along a second direction different to said first direction, so as to plug said card into said connector, said rectilinear translation, along said second direction, of said card, relative to said chassis, also being rectilinear translation, along said second direction, of said card, relative to said casing of said module.

The electronic card is advantageously secured to the module. The electronic card is advantageously fixed relative to the module during rectilinear translation along the first direction. The connector is advantageously secured to the chassis and advantageously fixed relative to the chassis. Advantageously, the connector enables connection of the electronic card to an electronic motherboard advantageously secured to the chassis and advantageously fixed relative to the chassis. At the same time the casing of the module is advantageously mobile in rectilinear translation along the first direction and immobile in rectilinear translation along the second direction, relative to the chassis. The direction of second rectilinear translation is advantageously parallel to the plugging direction of the electronic card into the connector. The portion of the electronic card which must be plugged into the connector is preferably a male portion plugging into a female connector, but the opposite is also possible, i.e., a female portion of an electronic card coupling with a male connector of the chassis.

To this end, the present invention also proposes a plug-in system, in a connector of a chassis, of an electronic card housed in a casing of an electronic module, comprising: a system for rectilinear translation of said module, relative to said chassis, along a first direction so as to insert said module into said chassis, a system for rectilinear translation of said card, relative to said chassis, along a second direction different to said first direction so as to plug said card into said connector, said system for rectilinear translation, along said second direction of said card relative to said chassis, also being a system for rectilinear translation, along said second direction, of said card, relative to said casing of said module.

To this end, the present invention also proposes an electronic module comprising a casing, an electronic card which is housed in said casing of said electronic module and which is intended to be plugged into a connector of a chassis, characterized in that it also comprises a system for rectilinear translation of said card relative to said casing, said system for rectilinear translation being arranged so as to make plugging of said card into a chassis connector easy, said system for rectilinear translation preferably being actuated by a mechanical actuator manually actuatable, and preferably an effort reduction system connecting said actuator to said card so as to reduce the manual actuation effort of said actuator to increase the plugging force.

According to preferred embodiments the invention comprises one or more of the following characteristics which can be used separately or in partial combination or in total combination, with all or some of the objects of the invention mentioned earlier.

The second direction is preferably perpendicular to the first direction. So, the electronic modules can be introduced to an electrical cabinet at the same time by horizontal sliding, which is more practical for the operator, and the electronic cards be plugged vertically into the connector, avoiding directional deflection means of the electrical connections often complex to manage, in particular since, in directional deflection means of electrical connection, all the tracks will not naturally follow paths of the same length, resulting in the need for additional compensation of different delays to resynchronize the signals corresponding respectively to the different tracks.

During said translation along the second direction, said card is preferably guided by said casing of said module, said casing of said module remaining immobile in translation along the second direction relative to the chassis. Therefore, more precise and therefore more fluid plugging of the electronic card in the connector without shock and without forcing can be undertaken, avoiding risk of long-term damage to the electrical connections of the electronic card, which can be stressed during maintenance operations when the electronic modules are withdrawn from and inserted to the chassis.

In a first preferred embodiment said rectilinear translation along said first direction so as to insert said module into said chassis is performed before said rectilinear translation along said second direction so as to plug said card into said connector. Uncoupling the two rectilinear translations both makes for easier placing of a more effective effort reduction system on the single rectilinear translation along the second direction. Also, this uncoupling of the two rectilinear translations allows for more controlled kinematics of the final phase of the plugging the electronic card into the connector, the rectilinear translation movement along the second direction being completely parallel to the plugging direction of the electronic card into the connector.

Preferably, said rectilinear translation along said second direction so as to plug said card into said connector is caused and driven by displacement of a mechanical actuator. Preferably, the actuator is actuated manually. In this way displacement of the electronic card during the final phase of being plugged into the connector is synchronized with displacement of the mechanical actuator itself synchronized with the movement of the operator which keeps complete control of the plugging process, and can stop without forcing as soon as it senses abnormal resistance, avoiding deterioration to the electronic card and the connector. The mechanical actuator is also robust, simple and relatively inexpensive.

Preferably, the travel of said displacement of said mechanical actuator is greater than the travel of said rectilinear translation along said second direction so as to plug said card into said connector, such that the first effort of said displacement of said mechanical actuator is weaker than the second effort of said rectilinear translation along said second direction so as to plug said card into said connector, an effort reduction system connecting said actuator to said card preferably such that said first effort is at least two times weaker than said second effort, preferably such that said first effort is at least five times weaker than said second effort. This effort reduction system connecting said actuator to said card performs plugging intrinsically needing a consequent effort, coming from the relatively high force which must be exerted to plug the electronic card into the connector by means of a more moderate effort from the operator performing the plugging, this plugging still remaining fully controlled by the operator, because of the synchronization between its movement and that of the electronic card plugging into the connector.

Preferably, the actuator is a lever mobile in rotation. The actuator mobile in rotation at the same time enables good effort reduction of this rotation towards the translation along the second direction, especially because of the lever arm, and reduced bulk of displacement volume of the actuator mobile in rotation. An actuator mobile in translation is also possible, but either the effort reduction will be less at equal bulk, or the bulk will be greater at equal effort reduction. Here it is particularly interesting to reduce the bulk of the displacement of the mobile actuator, as since the latter having to be accessible to the operator is located on the outside of the chassis, where it is best to least possible exceed the plane of the front of the chassis for safety reasons.

Preferably, said effort reduction system includes a rack and pinion system. This rack and pinion system allows robust effort reduction, which is interesting as this effort reduction can be fairly considerable, for example by a factor of 5 or 10, in a bulk volume reduced for the rack and pinion system, in particular because of its minimum thickness letting it be easily superposed on the electronic card in the electronic module.

Preferably, said rack and pinion system includes a mobile rod along the first direction, at least one mobile rod along the second direction, preferably two mobile rods along the second direction, and at least one gear wheel connecting the mobile rod along the first direction to a mobile rod along the second direction so as to transmit the movement of the mobile rod along the first direction to at least one mobile rod along the second direction. This rack and pinion system has a substantial surface, but by comparison minimum thickness which superposes it easily in the average plane of the electronic card in the electronic module.

Preferably, a locking system is arranged so as to allow said translation along the second direction only on completion of said translation along the first direction. This locking system offers significant additional safety as it prevents rectilinear translation from starting prematurely along the second direction before the electronic module is in the right position in the chassis, where no protruding element impairs rectilinear translation along the second direction, avoiding shocks between parts of the electronic module and parts of the chassis, which shocks would risk degrading some parts of the electronic module and/or of the chassis.

In a second optional embodiment, said rectilinear translation along said first direction so as to insert said module in said chassis is performed simultaneously to said rectilinear translation along said second direction so as to plug said card into said connector. The assembly of the plug-in device is simpler mechanically than for the first embodiment, but the effort reduction is both less efficacious and also the bulk, especially outside the front of the chassis, can be greater.

Preferably, the first course of said rectilinear translation along said first direction so as to insert said module in said chassis is longer than the second course of said rectilinear translation along said second direction so as to plug said card into said connector, such that the first effort of said rectilinear translation along said first direction so as to insert said module in said chassis is weaker than the second effort of said rectilinear translation along said second direction so as to plug said card into said connector, said first course being preferably at least two times longer than said second course. So effort reduction is undertaken, even if it is less than for the first embodiment.

The relative movement between said card and said casing of said module is preferably made by means of at least one assembly of a pin sliding in a rectilinear opening, the direction of said rectilinear opening being closer to the first direction than the second direction. This pin system sliding in a rectilinear opening is particularly simple mechanically. For the two embodiments, some other preferred characteristics, which can be combined with the previous ones or used alone, are now given.

Preferably, translation along the first direction is done horizontally relative to the chassis immobile relative to the ground, and the second translation is done vertically relative to this chassis.

Preferably, the effort reduction system lets the user make an effort at least 2 times less, or at least 5 times less, or at least 10 times less than the force required for plugging the electronic card into the connector. The required plugging force is preferably between 10 kg and 50 kg and even more preferably between 20 and 30 kg. Preferably, the range of effort to be provided by the operator is between 1 and 5 kg, and even more preferably between 3 and 4 kg.

A locking system is preferably positioned so that it both blocks the mechanical actuator in position when the electronic card is plugged into the connector and advantageously also so this it enables release of the mechanical actuator only by another specific gesture of the operator distinct from the displacement gesture of the mechanical actuator.

Other characteristics and advantages of the invention will emerge from the following description of a preferred embodiment of the invention, given by way of example and in reference to the appended drawings.

DETAILED DESCRIPTION OF THE INVENTION

In all FIGS. 1 to 11 the horizontal and vertical directions, represented by arrows H and V, are given relative to the chassis of an electrical cabinet installed on the ground. The direction of the arrow H shows the direction of translation in a first direction which is horizontal translation, while arrow V represents the direction of translation in a second direction, perpendicular to the first direction, which is vertical translation.

Figure 1:
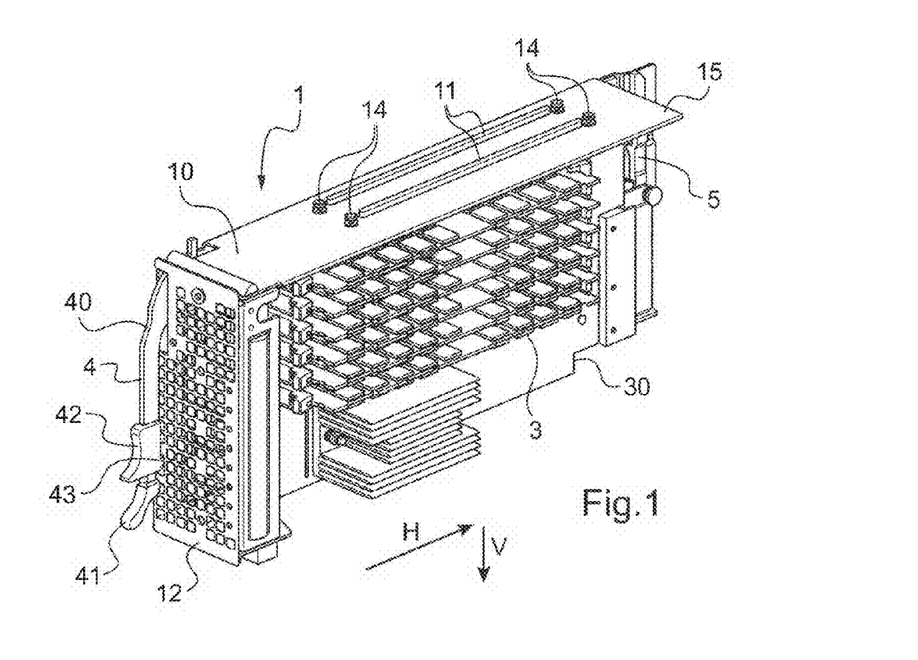
FIG. 1 schematically illustrates an example of electronic module according to an embodiment of the invention.

FIG. 1 schematically illustrates an example of an electronic module according to an embodiment of the invention. An electronic module 1 comprises a casing 10 in which is housed an electronic card 3. In its lower part, the electronic card 3 comprises a male portion 30 which can be plugged into a female connector belonging to the electronic motherboard of a chassis. The electronic card 3 is mobile in vertical translation relative to the casing 10. Vertical translation of the electronic card 3 is allowed only when a locking system 5 fixed on the casing 10 is unlocked.

The casing 10 comprises on its upper face 15 horizontal rails 11 and guide pins 14 which are located in the axis of the guide rails 11 and in the extension of the guide rails 11. The face of the casing intended to be in the plane of the front of the chassis is a grille 12 pierced by holes enabling aeration of the interior of the electronic module 1 and of the rest of the electronic chassis.

The vertical translation of the electronic card 3 is caused and driven by rotation of an actuator 4 mobile in rotation. This actuator 4 is a lever mobile in rotation. This lever 4 comprises a pivot point not evident in FIG. 1, an arm 40 having the actuation handle 41 at its end on which the operator presses to have the lever 4 pivot.

In vertical position, corresponding to the electronic card 3 plugged into the connector, the lever 4 is secured to the grille 12 by means of a spigot 43 which snap-locks into one of the holes of the grille 12. To release the spigot 43 from the grille 12, and therefore to let the lever 4 pivot upwards, the elastic piece 42 to which the spigot 43 is secured has to be lowered, this elastic piece being naturally held up by an element of spring type.

Figure 2:
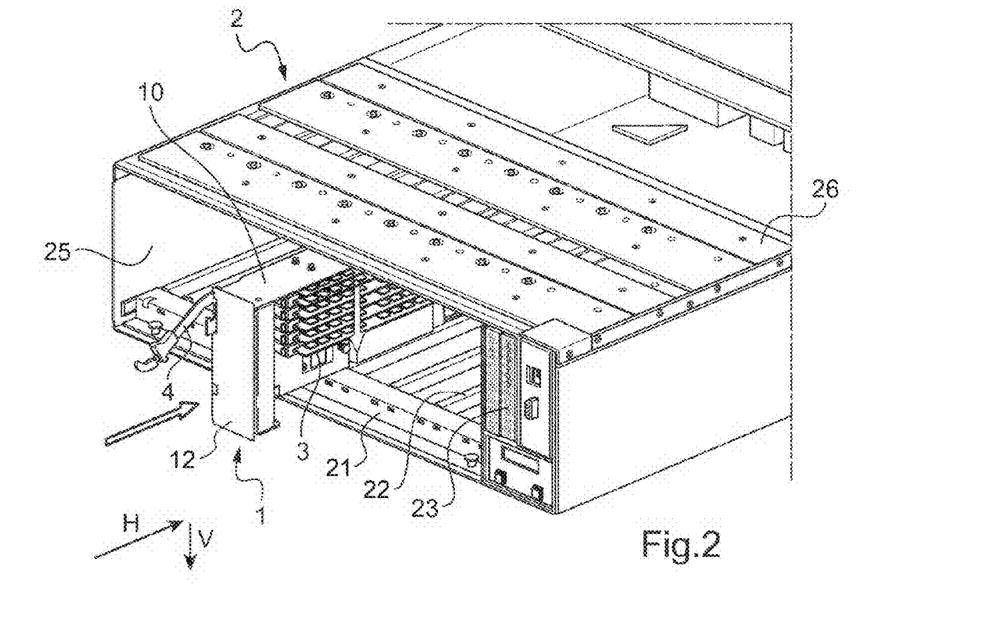
FIG. 2 schematically illustrates an example of an electronic module sliding in an electrical cabinet chassis in the manner of a drawer according to an embodiment of the invention.

FIG. 2 schematically illustrates an example of an electronic module sliding in an electrical cabinet chassis in the manner of a drawer according to an embodiment of the invention. A chassis 2 comprises a housing 25 enclosed by several walls, by a cover 26 and by a front 23 open to the exterior of the chassis 2. The opening of the front 23 comprises a protective rim 21 in its lower part. Arranged at the base of the housing 25 is an electronic motherboard 22. By means of its guide rails 11 which slide in grooves of the cover 26 of the chassis 2, the electronic module 1 is introduced into the housing 25 of the chassis 2 via horizontal translation towards the interior of the chassis, i.e., to the right in FIG. 2. The lever 4 is in a raised position.

Figure 3:
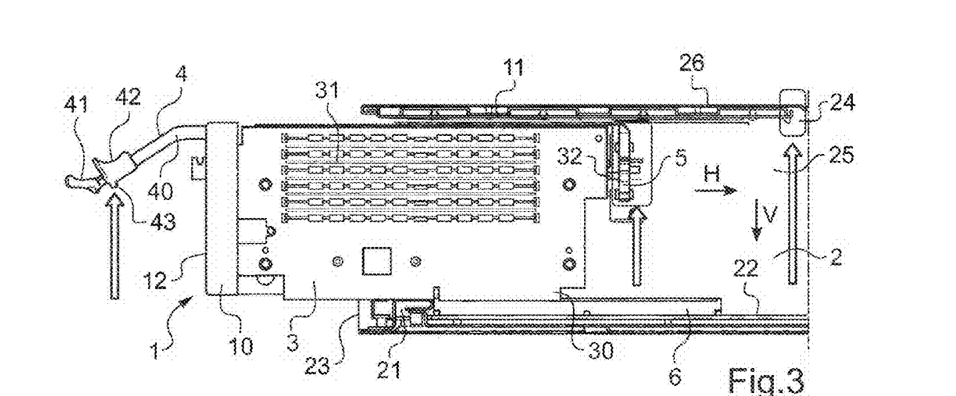
FIG. 3 schematically illustrates an example of a first horizontal sliding phase of an electronic module sliding in an electrical cabinet chassis according to an embodiment of the invention.

FIG. 3 schematically illustrates an example of a first phase of horizontal sliding of an electronic module sliding in an electrical cabinet chassis according to an embodiment of the invention. The electronic card 3 comprises electronic components 31, for example of memory type or other, the tracks of which will have to be connected to the tracks of the electronic components of the electronic motherboard 22. The electronic card 3 is linked to a protrusion 32 which stays blocked by the locking system 5 in locked position, blocking the lever 4 in a raised position and preventing vertical translation downwards of the electronic card 3 relative to the rest of the casing 10. In fact, as long as the electronic card 3 is not completely inserted into the housing 25 of the chassis 2 and has not gone past the rim 21, it is best to prevent vertical translation downwards of the electronic card 3 which could cause deterioration of its male portion 30 from shock against the rim 21. Situated behind in the chassis 2 is a latch 24 intended to unlock the locking system 5. At the base of the chassis 2, fixed to the electronic motherboard 22, is a female connector 6 into which the male portion 30 of the electronic card 3 can be plugged.

Figure 4:
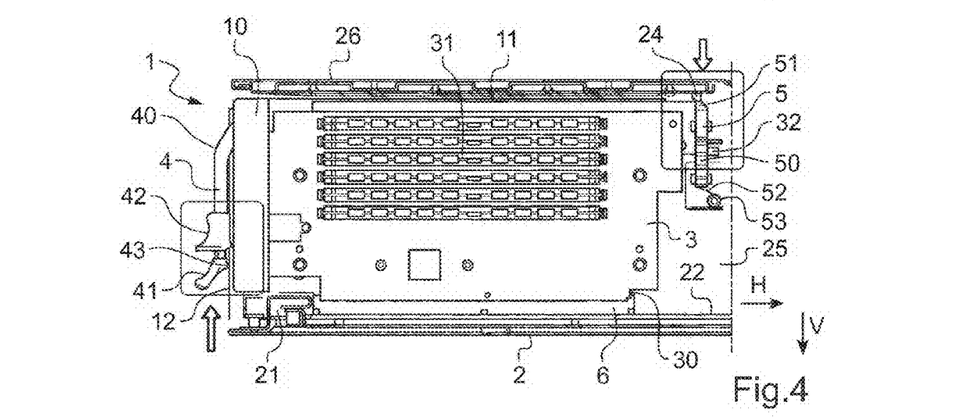
FIG. 4 schematically illustrates an example of a second phase of vertical plugging of the electronic card of an electronic module into the connector of an electrical cabinet chassis according to an embodiment of the invention.

FIG. 4 schematically illustrates an example of a second phase for vertical plugging of the electronic card of an electronic module into the connector of an electrical cabinet chassis according to an embodiment of the invention. As in FIG. 3 and FIG. 4, the displacement travel of the handle 41 by its rotation is far greater than the course of displacement of the electronic card 3 by its vertical translation downwards.

The locking system 5 was unlocked by the latch 24 on completion of travel. In fact, the beveled point 51 of the locking system 5 slid on the beveled latch 24 so as to lower the rod 50 such that the protrusion 32 is no longer blocked by the rod 50 but instead can pass through the rod 50, i.e., move into an orifice of the rod 50 now facing the protrusion 32. The rod 50 was held upwards by a spring 52 pushing upwards. The spring 52 tends to turn in a clockwise direction about the axis 53, pushing the rod 50 upwards.

This displacement of the protrusion 32 releases the mobility in vertical translation of the electronic card 3. In this way, the operator can lower the lever 4 in a lowered position against the grille 12 of the electronic module 1 by exerting manual pressure on the handle 41, compelling the spigot 43 to snap-lock in a hole of the grille 12, blocking the lever 4 in a lowered position. Lowering the lever 4 has directly and mechanically caused and driven vertical translation downwards of the electronic card 3 relative to the casing 10, enabling plugging of its male portion 30 into the female connector 6.

Figure 5:
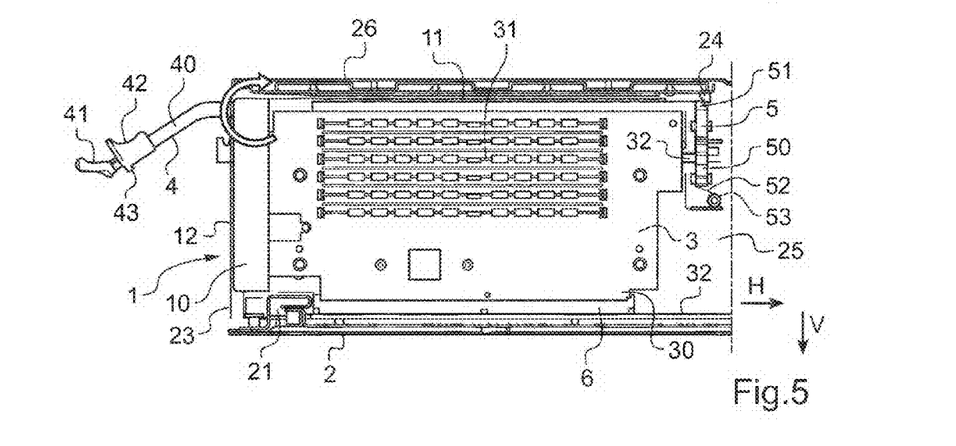
FIG. 5 schematically illustrates an example of a vertical extraction phase of the electronic card of an electronic module outside the connector of an electrical cabinet chassis according to an embodiment of the invention.

FIG. 5 schematically illustrates an example of a vertical extraction phase of the electronic card of an electronic module outside the connector of an electrical cabinet chassis according to an embodiment of the invention. To extract the electronic card 3 from the connector 6, the operator starts by lowering the elastic piece 42 so as to free the spigot 43 from the grille 12. Next, the operator lifts the lever 4 by having it pivot in a clockwise direction. Rotation of the lever 4 causes both extraction of the male portion 30 from the electronic card 3 outside the female connector 6, and also extraction of the protrusion 32 outside the orifice of the rod 50.

In this way, as soon as the horizontal translation towards the exterior of the chassis 2 starts, i.e., towards the left in FIG. 5, the beveled point 51 of the rod 50 will move away from the beveled latch 24 and the rod 50, no longer held by the protrusion 32, will rise under the effect of the pressure of the spring 52. With the rod 50 raised, its orifice will no longer be facing the protrusion 32, and the lever 4 will therefore remain blocked in a raised position. All the operator has to do now is continue horizontal translation of the entire electronic module 1 towards the exterior of the chassis 2, until electronic module 1 is fully withdrawn from the chassis 2. Maintenance operations could easily be carried out on the electronic module 1, completely separate from the chassis 2.

Figure 6:
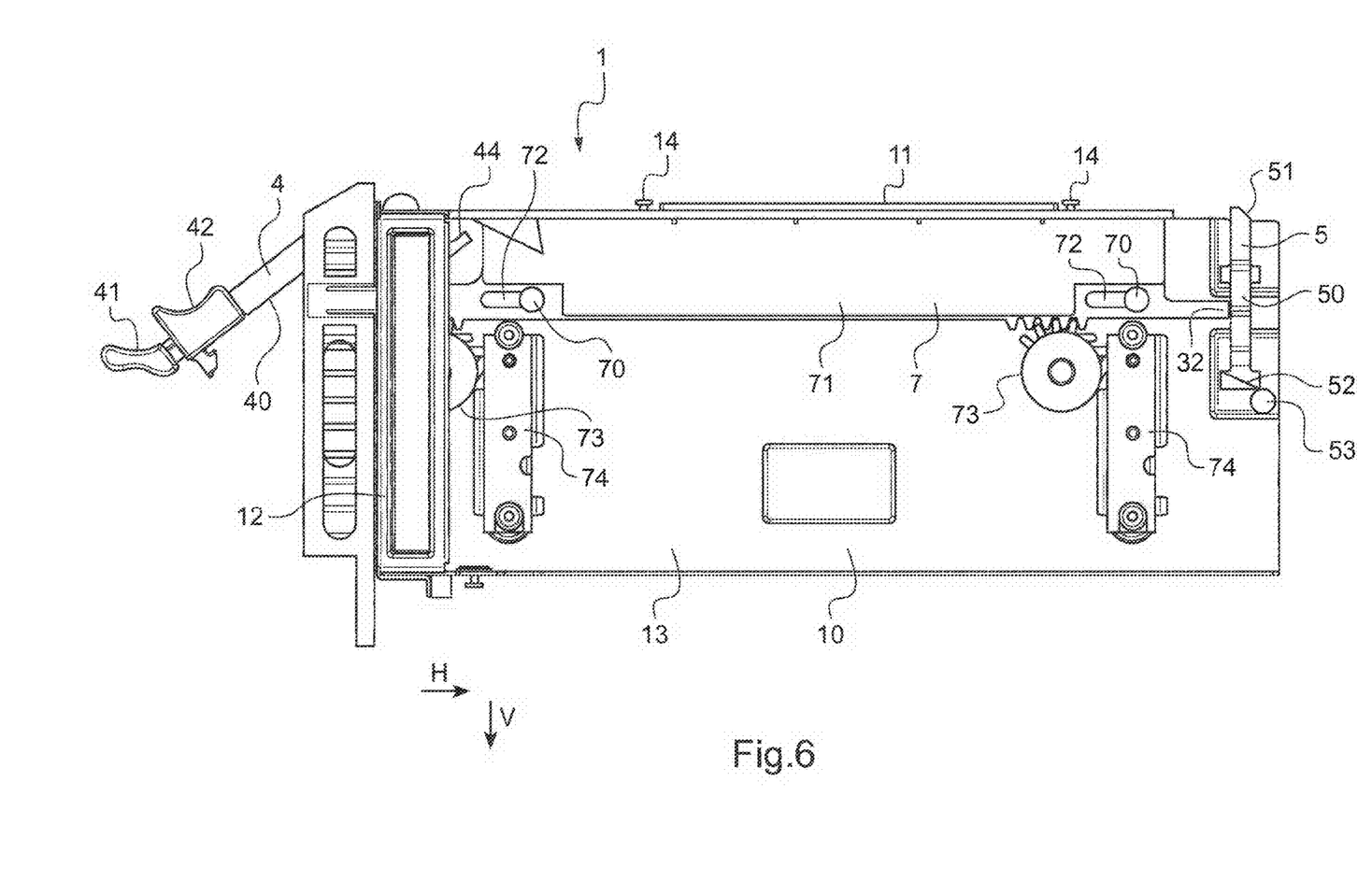
FIG. 6 schematically illustrates a side view of an example of a casing of an electronic module according to a first embodiment of the invention, just prior to completion of the horizontal translation phase.
Figure 7:
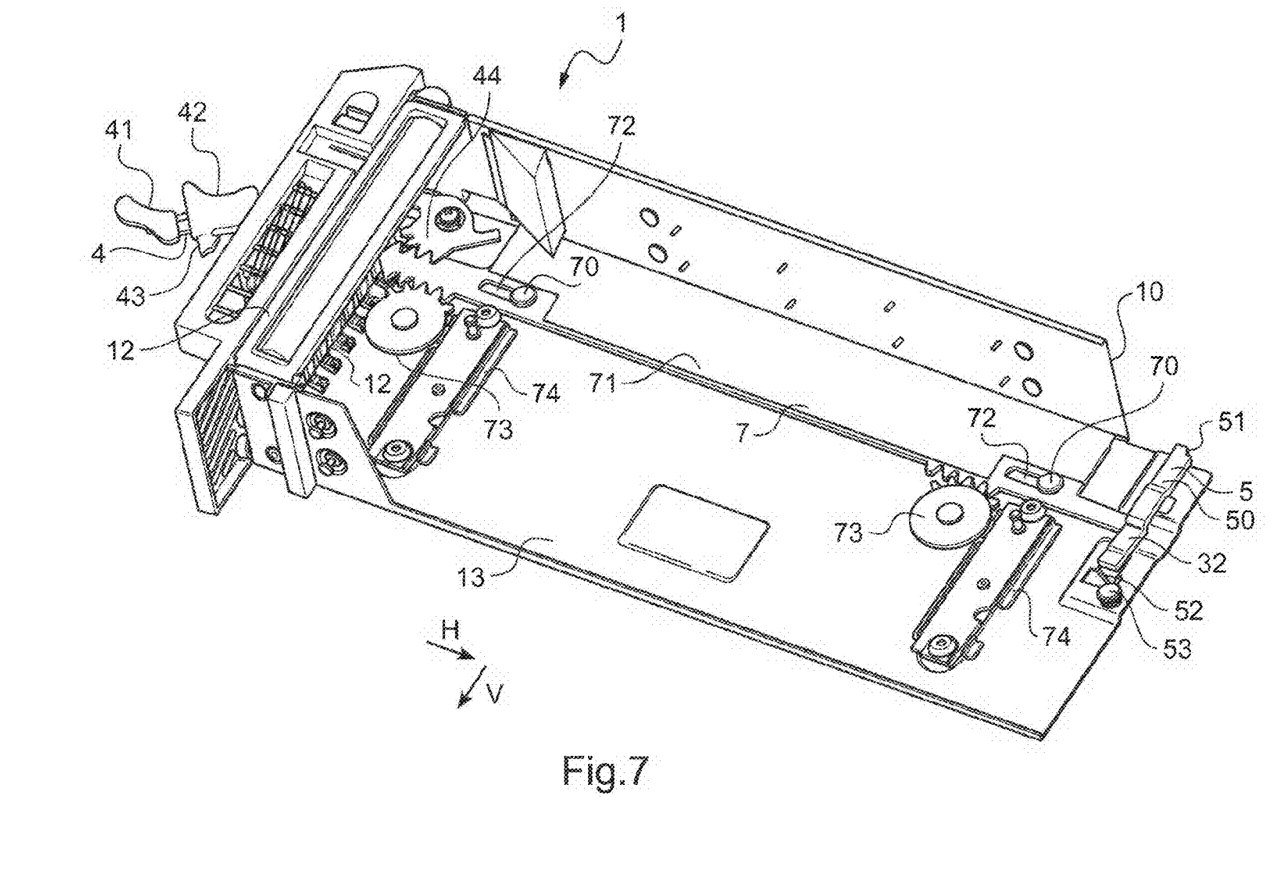
FIG. 7 schematically illustrates a perspective view of an example of a casing of an electronic module according to a first embodiment of the invention, just prior to completion of the horizontal translation phase.
Figure 8:
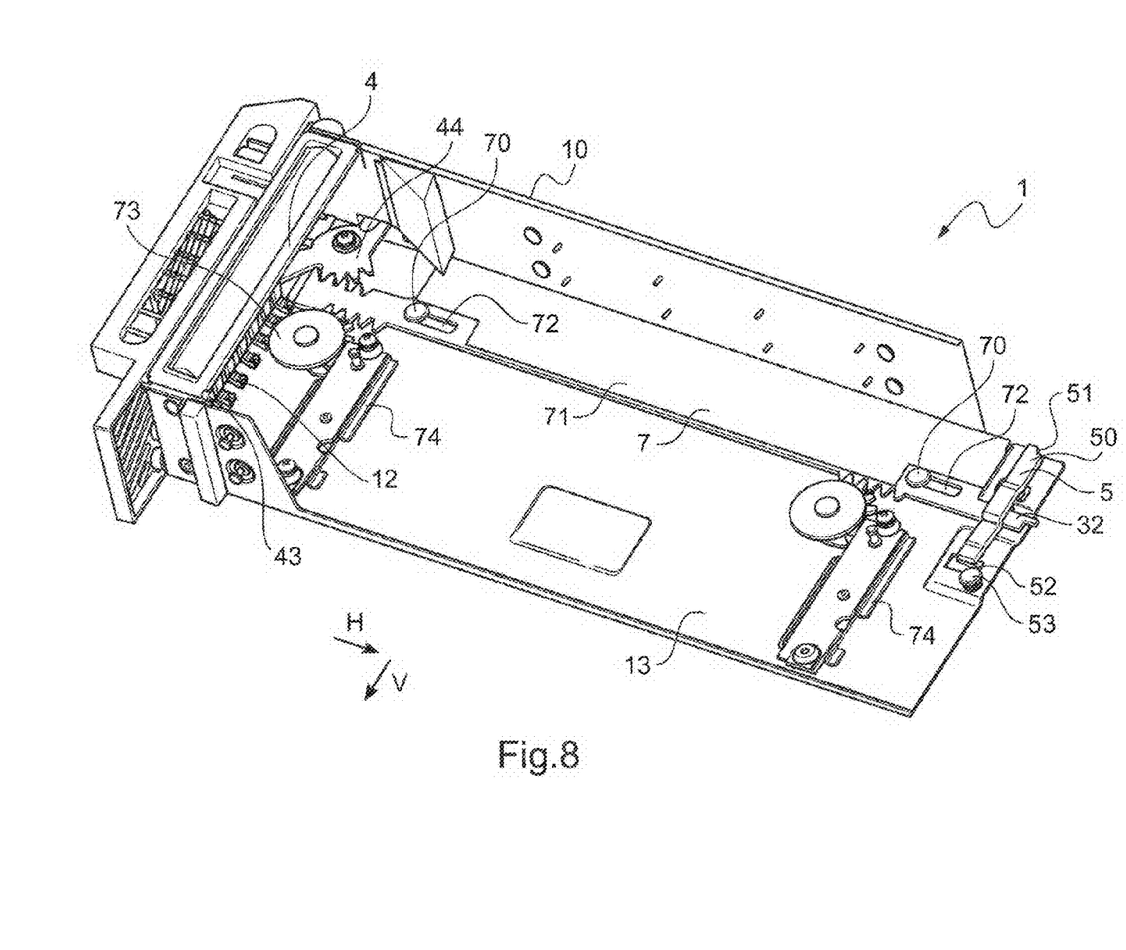
FIG. 8 schematically illustrates a perspective view of an example of a casing of an electronic module according to a first embodiment of the invention, on completion of the horizontal translation phase.

FIG. 6 schematically illustrates a side view of an example of a casing of an electronic module according to a first embodiment of the invention, just before completion of the horizontal translation phase. FIG. 7 schematically illustrates a perspective view of an example of a casing of an electronic module according to a first embodiment of the invention, just before completion of the horizontal translation phase. FIG. 8 schematically illustrates a perspective view of an example of a casing of an electronic module according to a first embodiment of the invention, on completion of the horizontal translation phase.

An effort reduction system 7 reduces the effort of the operator on the lever 4 to exert much greater force for plugging the electronic card 3 into the connector 6, transforming rotation of the lever 4 in an anticlockwise direction into vertical translation downwards of the electronic card 3 relative to the casing 10. For clarity, the electronic card 3 is not shown but it is fixed on the vertically mobile rods 74. The effort reduction system 7 is a rack and pinion system which includes a horizontally mobile rod 71, two vertically mobile rods 74, two gear wheels 73 connecting respectively the horizontally mobile rod 71 to the vertically mobile rods 74 so as to transmit movement from the horizontally mobile rod 71 to the vertically mobile rods 74. Pins 70 secured to the wall of the casing 10 cooperate with openings 72 included in the horizontally mobile rod 71, during horizontal translation of the horizontally mobile rod 71.

The operation is as follows starting out from FIGS. 6 and 7 and arriving at FIG. 8. When the operator lowers the lever 4 by having it pivot in an anticlockwise direction as far as the vertical, the spigot 43 snap-locks in a hole of the grille 12, keeping the lever 4 blocked in a lowered position. This pivoting of the lever 4 in an anticlockwise direction causes rotation of the gear wheel 44 located at the end of the arm 40 in the same direction. Rotation of the gear wheel 44 in an anticlockwise direction causes horizontal translation of the horizontally mobile rod 71 towards the interior of the chassis 2 not shown (i.e., to the right in FIGS. 6 and 7). The relative displacement of the pins 70 relative to the openings 72 is made from right to left; in fact, the pins 70 are fixed relative to the casing 10, while the openings 72 move with the horizontally mobile rod 71. The horizontal translation of the horizontally mobile rod 71 to the right drives joint rotation of the gear wheels 73 in a clockwise direction, which in turn causes joint vertical translation of the vertically mobile rods 74 downwards, which causes vertical translation downwards of the electronic card 3 ending in its plugging to the connector 6.

Inversely, the operation is the as follows based starting from FIG. 8 and arriving at FIGS. 6 and 7. When the operator lifts the elastic piece 42 along the arm 40, the spigot 43 is released from the grille 12 and the operator can then lift the lever 4 by having it pivot in a clockwise direction as far as the raised position of the lever 4. This pivoting of the lever 4 in a clockwise direction causes rotation in the same direction of the gear wheel 44 located at the end of the arm 40. Rotation of the gear wheel 44 in a clockwise direction causes horizontal translation of the horizontally mobile rod 71 towards the exterior of the chassis 2 not shown (i.e., to the left in FIG. 8).

The relative displacement of the pins 70 relative to the openings 72 is done from left to right; in fact, the pins 70 are fixed relative to the casing 10, while the openings 72 move with the horizontally mobile rod 71. Horizontal translation of the horizontally mobile rod 71 towards the left causes joint rotation of the gear wheels 73 in an anticlockwise direction, which in turn causes joint vertical translation of the vertically mobile rods 74 upwards, which causes vertical translation upwards of the electronic card 3 resulting in its extraction outside the connector 6.

Figure 9:
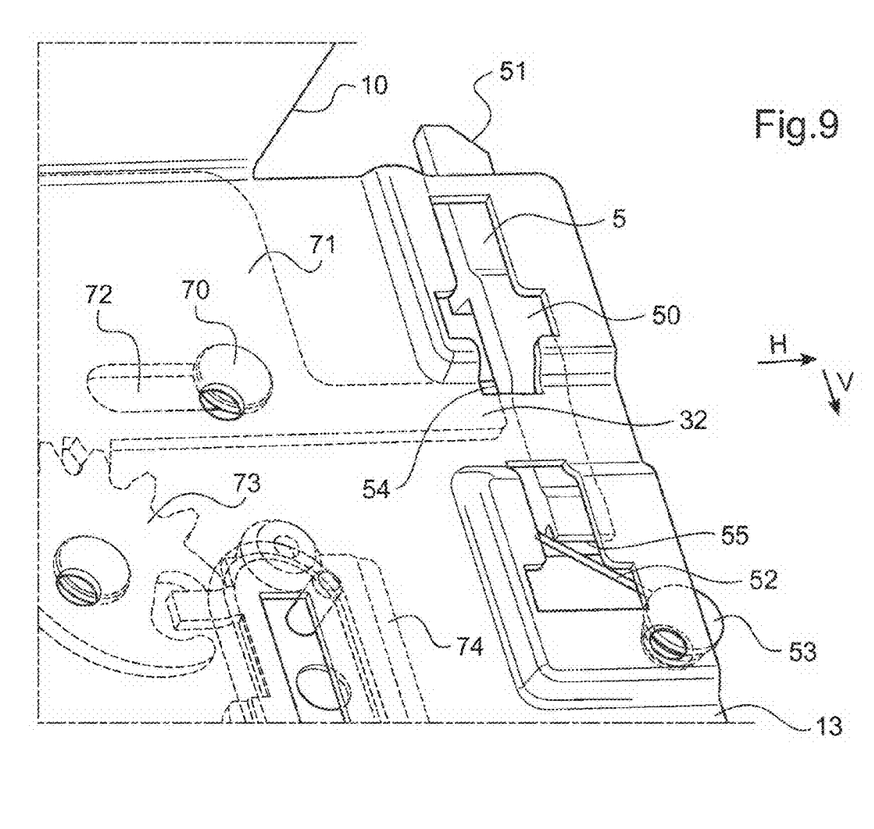
FIG. 9 schematically illustrates a detail of the locking system blocking the vertical translation plugging for an electronic module according to a first embodiment of the invention.

FIG. 9 schematically illustrates a detail of the locking system blocking the vertical translation plugging for an electronic module according to a first embodiment of the invention. The orifice 54 of the rod 50 in which the end of the protrusion 32 can slide when it is facing is clearly visible. The same applies for the groove 55 of the rod 50 in which the spring 52 is housed to push the rod 50 upwards.

Figure 10:
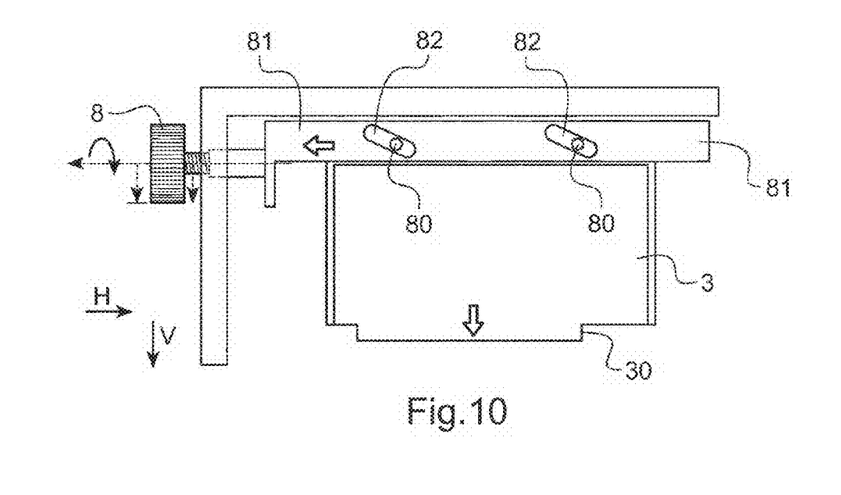
FIG. 10 schematically illustrates a side view of an example of an electronic module according to a first variant of a second embodiment of the invention.

FIG. 10 schematically illustrates a side view of an example of an electronic module according to a first variant of a second embodiment of the invention. Here, the electronic card 3 is secured to a bar 81 which includes openings 82 in which pins 80 secured to the casing 10 slide. The oblique arrangement of the openings 82 transforms the horizontal translation of the bar 81 into vertical translation of the electronic card 3. An angle of under 45 degrees, preferably between 10 and 30 degrees, and even more preferably around 20 degrees, of the axis of the openings 82 relative to the horizontal, also reduces the horizontal translation effort into a greater vertical plugging force, but in a proportion less than for the first embodiment. Here, horizontal translation of the bar 81 directly and simultaneously causes vertical translation of the electronic card 3. Horizontal translation of the bar 81 is performed by means of a motor 8, the rotation of which drives that of an endless screw horizontally pushing or pulling the bar 81.

Figure 11:
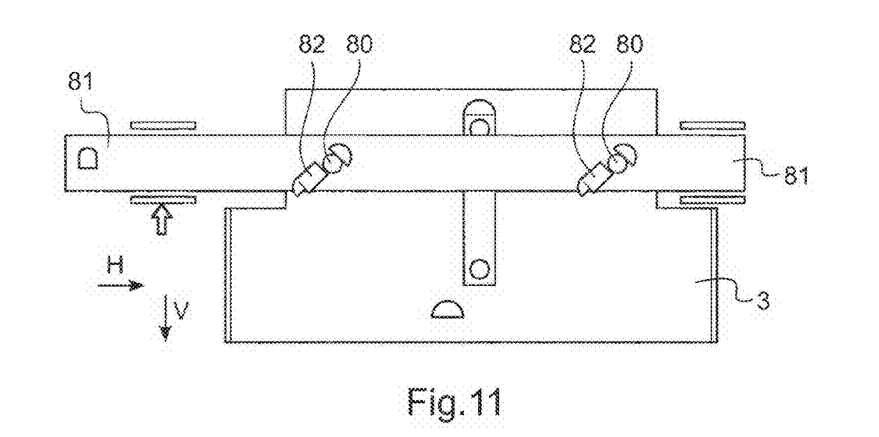
FIG. 11 schematically illustrates a side view of an example of an electronic module according to a second variant of a second embodiment of the invention.

FIG. 11 schematically illustrates a side view of an example of electronic module according to a second variant of a second embodiment of the invention. Horizontal translation of the bar 81 is manually realized here, the operator directly horizontally pushing or pulling the bar 81.

Of course, the present invention is not limited to the described and illustrated examples and embodiment, but it is amenable to many variants accessible to the person skilled in the art.

The invention claimed is:

1. A method for plugging, into a connector of a chassis, an electronic card housed in a casing of an electronic module, the method comprising:

a first rectilinear translation of said module, relative to said chassis, along a first direction so as to insert said module into said chassis, the casing including i) a locking system that, in a locked position, prevents vertical translation of the card relative to the casing, ii) a mechanical actuator mobile in rotation, rotation of the actuator causing rectilinear translation of the card relative to the casing, and iii) a protrusion that, with the locking system being in the locked position, blocks the actuator from rotation, the card being linked to the protrusion such that the blocking of the protrusion prevents the rotation of the actuator and thereby prevents the rectilinear translation of the card relative to the casing, wherein the first rectilinear translation of the module continues until the casing acts against a latch of the chassis, the casing acting against the latch unlocking the locking system, the unlocking of the locking system unblocking the protrusion and thereby allowing the rotation of the actuator to drive translation of the card; and rotation of said actuator to provide a second rectilinear translation of said card, relative to said chassis, along a second direction different to said first direction so as to plug said card into said connector, said second rectilinear translation of said card along said second direction, relative to said chassis also being rectilinear translation of said card, along said second direction relative to said casing of said module, wherein said first rectilinear translation along said first direction so as to insert said module into said chassis is executed before said second rectilinear translation along said second direction so as to plug said card into said connector, wherein the locking system is positioned so as to authorize said rotation of said actuator to provide the second translation along the second direction only after a completion of said first translation along the first direction that causes the casing to act against the latch unlocking the locking system, and wherein said second rectilinear translation along said second direction so as to plug said card into said connector is caused and driven by displacement of the actuator from a first position to a second position, said actuator being blocked during said first rectilinear translation along said first direction and is unblocked on the completion of said first rectilinear translation along said first direction by the casing acting against the latch to unlock the locking system and thereby unlock the actuator for the displacement from the first position to the second position.

2. The plugging method according to claim 1, wherein, the first position is a raised position with the actuator extending away from an end of the casing and the second position is a lowered position with the actuator being adjacent the end of the case, and a course of said displacement of said actuator is greater than a course of said second rectilinear translation along said second direction so as to plug said card into said connector such that the first effort of said displacement of said mechanical actuator is weaker than the second effort of said rectilinear translation along said second direction so as to plug said card into said connector, an effort reduction system connecting said actuator to said card.

3. The plugging method according to claim 2, wherein the actuator is manually actuated.

4. The plugging method according to claim 3, wherein the actuator is a lever with an arm that is mobile in rotation and, during the second rectilinear translation, the arm pivots about from the first position to the second position such that the arm moves from an initial extending away from the end of the casing to the second position with the arm being adjacent the end of the case, the arm being in the raised, first position when the actuator is blocked.

5. The plugging method according to claim 2, wherein said effort reduction system includes a rack and pinion system.

6. The plugging method according to claim 5, wherein said rack and pinion system includes a mobile rod along the first direction, at least one mobile rod along the second direction, and at least one gear wheel connecting the mobile rod along the first direction to a mobile rod along the second direction so as to transmit the movement of the mobile rod along the first direction to at least one mobile rod along the second direction.

7. The plugging method according to claim 1, wherein the second direction is perpendicular to the first direction.

8. The plugging method according to claim 1, wherein during said second translation along the second direction said card is guided by said casing of said module, said casing of said module remaining immobile in translation along the second direction relative to the chassis.

9. The plugging method according to claim 3, wherein said effort reduction system includes a rack and pinion system.

10. The plugging method according to claim 4, wherein said effort reduction system includes a rack and pinion system.

11. The plugging method according to claim 1, wherein the actuator is blocked when said electronic card is plugged into said connector.

12. The method of claim 1, wherein,
the first position is a raised position with the actuator extending away from an end of the casing and the second position is a lowered position with the actuator being adjacent the end of the case, and
the actuator is a lever mobile in rotation with an arm that pivots from the raised, first position where the arm extends away from the end of the casing to the lower, second position where the arm is adjacent the end of the case,
the arm being in the raised position when the actuator is blocked.

13. The method of claim 1, wherein,
the locking system comprises a bias element and a rod, the bias element biasing the rod into a position that blocks the protrusion,
wherein the completion of travel brings a top of the rod to act against the latch thereby moving the rod against the bias element and away from the position that blocks the protrusion to allow the protrusion to move beyond the rod, thereby unblocking the actuator and allowing the rotation of the actuator.

14. The method of claim 1, wherein,
the first position is a raised position with the actuator extending away from an end of the casing and the second position is a lowered position with the actuator being adjacent the end of the case, and
the actuator is a lever mobile in rotation with an arm that pivots from the raised, first position where the arm extends away from the end of the casing to the lower, second position where the arm is adjacent the end of the case,
the arm being in the raised position when the actuator is blocked,
the locking system comprises a bias element and a rod, the bias element biasing the rod into a position that blocks the protrusion,
wherein the completion of travel brings a top of the rod to act against the latch thereby moving the rod against the bias element and away from the position that blocks the protrusion to allow the protrusion to move beyond the rod, thereby unblocking the actuator and allowing the rotation of the arm of the actuator from the first position to the second position.

15. A system for plugging, into a connector of a chassis, an electronic card housed in a casing of an electronic module, the system comprising:
a system for rectilinear translation of said module, relative to said chassis, along a first direction so as to insert said module in said chassis, the module including the casing in which the card is housed;
a system for rectilinear translation of said card, relative to said chassis, along a second direction different to said first direction so as to plug said card into said connector, the system for rectilinear translation comprising a mechanical actuator operatively connected to the card, rotation of the actuator about a pivot driving translation of the card,
said system for rectilinear translation of said card, along said second direction relative to said chassis, also being a system for rectilinear translation of said card, along said second direction relative to said casing of said module;
a locking system positioned so as to authorize said translation along the second direction only after the end of said translation along the first direction, the locking system fixed on the casing, wherein with the locking system in a locked position, the card is immobile in translation relative to the case, and with the locking system in an unlocked position, the card is mobile in translation relative to the case;
a protrusion that, with the locking system being in the locked position, blocks the actuator from rotation, the card being linked to the protrusion such that the blocking of the protrusion prevents the rotation of the actuator and thereby prevents the rectilinear translation of the card relative to the casing; and
a latch located in the chassis, wherein completion of the rectilinear translation of said module relative to said chassis along the first direction, during insertion of said module in said chassis, causes the casing to act against the latch to unlock the locking system, the unlocking of the locking system unblocking the protrusion and thereby allowing the rotation of the actuator to drive said rectilinear translation along said second direction so as to plug said card into said connector of the chassis.

16. The system of claim 15, wherein,
the actuator is a lever mobile in rotation with an arm that pivots from a first raised position where the arm extends away from an end of the casing to a second lower position where the arm is adjacent the end of the case, the arm being in the raised position when the actuator is blocked.

17. The system of claim 15, wherein, the locking system comprises a bias element and a rod, the bias element biasing the rod into a position that blocks the protrusion, wherein the completion of travel brings a top of the rod to act against the latch thereby moving the rod against the bias element and away from the position that blocks the protrusion to allow the protrusion to move beyond the rod, thereby unblocking the actuator and allowing the rotation of the actuator.

18. The system of claim 15, wherein, the actuator is a lever mobile in rotation with an arm that pivots from a first raised position where the arm extends away from an end of the casing to a second lower position where the arm is adjacent the end of the case, the arm being in the raised position when the actuator is blocked, the locking system comprises a bias element and a rod, the bias element biasing the rod into a position that blocks the protrusion, and the completion of travel brings a top of the rod to act against the latch thereby moving the rod against the bias element and away from the position that blocks the protrusion to allow the protrusion to move beyond the rod, thereby unblocking the actuator and allowing the rotation of the arm of the actuator from the first raised position to the second lower position.

19. An electronic module comprising:

a casing, an electronic card which is housed in said casing of said electronic module and which is intended to be plugged into a connector of a chassis comprising a latch, a system for rectilinear translation of said card relative to said casing, said system for rectilinear translation being positioned to facilitate the plugging of said card into the connector of the chassis, said system for rectilinear translation being actuated by a mechanical actuator manually actionable, said mechanical actuator being blocked from rotation by a locking system that is released from a locking position by a translation of the module against the latch of the chassis, the translation of the module against the latch changing a position of the locking system to thereby release the actuator to allow manual rotation of the actuator to drive the card into the connector of the chassis.

* * * * *